United States Patent [19]

Berkcan et al.

[11] Patent Number: 5,587,651
[45] Date of Patent: *Dec. 24, 1996

[54] ALTERNATING CURRENT SENSOR BASED ON PARALLEL-PLATE GEOMETRY AND HAVING A CONDUCTOR FOR PROVIDING SEPARATE SELF-POWERING

[75] Inventors: Ertugrul Berkcan, Schenectady, N.Y.; Raymond K. Seymour, Plainville, Conn.

[73] Assignee: General Electric Company, Schenectady, N.Y.

[*] Notice: The term of this patent shall not extend beyond the expiration date of Pat. No. 5,587,652.

[21] Appl. No.: 342,503

[22] Filed: Nov. 21, 1994

[51] Int. Cl.$^6$ ............................... G01R 1/04; G01R 33/00
[52] U.S. Cl. .............................................. 324/127; 324/126
[58] Field of Search ................................ 324/117 R, 126, 324/127, 158.1, 73.1, 117 H; 336/223, 181, 182, 221; 338/120, 333, 49

[56] References Cited

U.S. PATENT DOCUMENTS

| | | | |
|---|---|---|---|
| 2,724,821 | 11/1955 | Schweitzer, Jr. | 324/127 |
| 4,182,982 | 1/1980 | Wolf et al. | 324/127 |
| 4,492,919 | 1/1985 | Milkovic | 324/127 |
| 4,580,095 | 4/1986 | DeVries | 324/126 |
| 4,639,665 | 1/1987 | Gary | 324/251 |
| 4,794,326 | 12/1988 | Friedl | 324/117 R |
| 4,810,989 | 3/1989 | Brandenberg et al. | 336/84 M |
| 4,894,610 | 1/1990 | Friedl | 324/117 R |
| 4,939,448 | 7/1990 | Gudel | 324/251 |
| 5,066,904 | 11/1991 | Bullock | 324/126 |
| 5,107,204 | 4/1992 | Bullock et al. | 324/127 |

OTHER PUBLICATIONS

"Split–Conductor Current Sensors with Electronic Load Termination", Miran Milkovic, IEEE Transactions on Instrumentation and Measurement, vol. 41, No. 4, Aug. 1992, pp. 540–547.
"Electrical Measurements" by Frank A. Laws, Massachuseets Institute of Technology, 1938, pp. 72–75.

Primary Examiner—Vinh P. Nguyen
Attorney, Agent, or Firm—Marvin Snyder

[57] ABSTRACT

A current sensor includes a first conductor plate, a second conductor plate positioned in spaced relationship relative to the first conductor plate and facing the first conductor plate, and a third conductor plate for electrically interconnecting the first and second conductor plates to form a connected conductive path along the first and second conductor plates. The first and second conductor plates are shaped to form respective magnetic field constituents around each of the first and second conductor plates during current flow along the conductive path. A sensing coil, such as one or more air-core coils, is provided for sensing changes in magnetic flux within a predetermined sense region. An individual conductor, such as a rectangular plate or a suitably shaped conductive structure, is further provided for carrying all the current which flows along the conductive path to produce a magnetic field over a conductor region. The sense and conductor regions are preferably nonoverlapping with respect to one another. A transformer, such as a current transformer, is magnetically coupled to the individual conductor to supply a predetermined level of electrical current which can be conveniently employed for electrically powering various circuits associated with the current sensor.

21 Claims, 5 Drawing Sheets

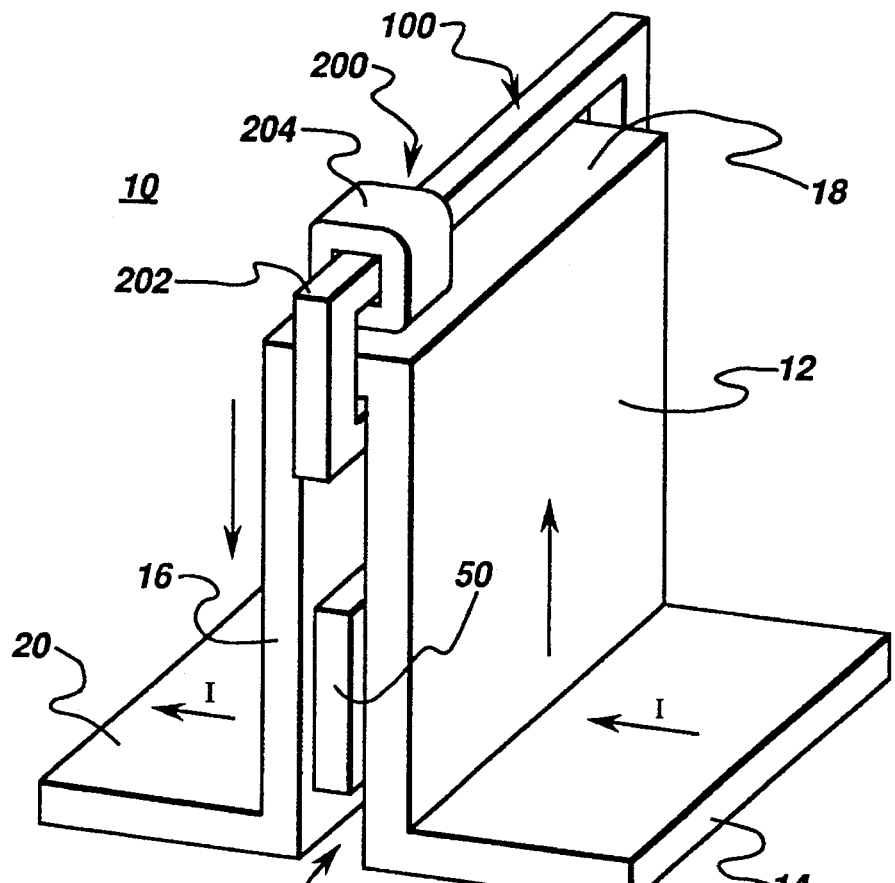
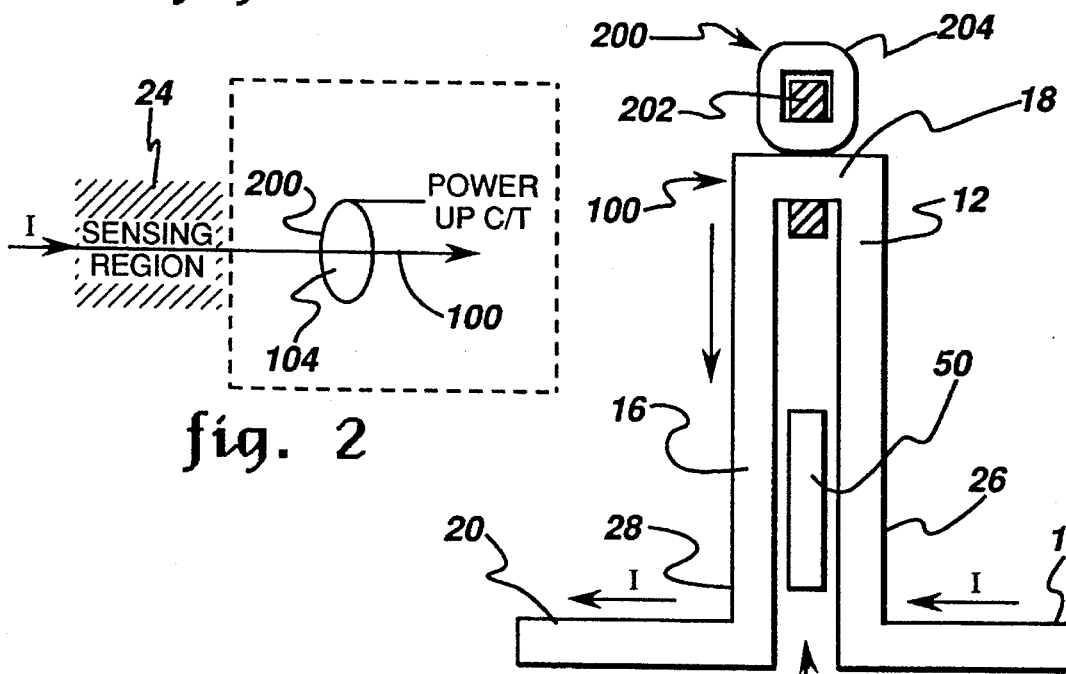
fig. 3a
fig. 2
fig. 3b

ALTERNATING CURRENT SENSOR BASED ON PARALLEL-PLATE GEOMETRY AND HAVING A CONDUCTOR FOR PROVIDING SEPARATE SELF-POWERING

This application is related to U.S. patent application Ser. No. 08/342,510 entitled "An Alternating Current Sensor Employing Parallel Plates And Having High Dynamic Range and Accuracy" by E. Berkcan; U.S. patent application Ser. No. 08/342,505 entitled "Alternating Current Sensor Based On Parallel-Plate Geometry And Having A Shunt For Self-Powering" by E. Berkcan et al.; U.S. patent application Ser. No. 08/342,504 entitled "Alternating Current Sensor Based on Concentric-Pipe Geometry And Having A Transformer For Providing Separate Serf-powering" by E. Berkcan et al. Each of the above-listed applications is filed concurrently with the present application, assigned to the assignee of the present invention and herein incorporated by reference.

BACKGROUND OF THE INVENTION

This invention relates to current sensors and, more particularly, to an alternating current sensor employing parallel-plate geometry and having a conductor for providing separate self-powering.

Current sensors, such as U.S. Pat. No. 5,066,904, entitled "Coaxial Current Sensors," by Bullock, issued Nov. 19, 1991, assigned to the assignee of the present invention and herein incorporated by reference, are known in the art. These sensors, although useful, suffer from some disadvantages including the need for an accurate current shunt which is meticulously designed for providing a highly accurate current measurement. For instance, use of such accurate shunt helps somewhat to reduce the size, weight, and expense of the current sensor by reducing the number of ampere-turns in the active part of the current sensor. However, even the use of an accurate current shunt typically introduces some expense due to the current sensor materials, such as low temperature coefficient materials, the large number of coil "turns" in the sensing and feedback coils on the current shunt, as well as the manufacturing care required to fabricate the current sensor. Thus, a need exists for a current sensor that overcomes these problems, that is, a current sensor that conveniently avoids the need of any current shunt in order to provide an accurate current measurement.

Moreover, since current sensors typically have associated circuitry, such as signal conditioning circuits, signal processing circuits, control circuits and the like, it is also desirable for the current sensor to have a self-powering capability which allows for electrically powering such associated circuits in a manner which is essentially independent or separate from any current measurement or current sensing operation being performed in the current sensor. This is particularly desirable since the respective design and accuracy requirements of any current shunt and associated transformer that are employed both for current sensing and for self-powering, are typically much more demanding or restrictive than would be the respective design and accuracy requirements of an individual, uncomplicated conductor and associated transformer which are exclusively dedicated for self-powering. For example, this would advantageously allow for further reducing the size, weight, and cost of the current sensor due to the greater flexibility of design and lower expense of an individual conductor and transformer which are exclusively dedicated for self-powering, as compared to a current shunt and transformer which must also provide highly accurate current measurements. Moreover, high-power circuit breaker applications generally require current sensors having a high dynamic range and accuracy while maintaining a relatively low cost and size.

SUMMARY OF THE INVENTION

Generally speaking, the present invention fulfills the foregoing needs by providing an alternating current sensor that comprises a first conductor plate, a second conductor plate positioned in spaced relationship relative to the first conductor plate and substantially facing the first conductor plate, and a third conductor plate for electrically interconnecting the first and second conductor plates to form a connected conductive path along the first and second conductor plates. The first and second conductor plates are shaped to form respective magnetic field constituents substantially around each of the first and second conductor plates during current flow along the conductive path. Sensing means, such as one or more air-core coils, is provided for sensing changes in magnetic flux within a predetermined sense region, such as in a passage between the first and second conductor plates and/or near respective outer surfaces of the first and second conductor plates. Conductor means, such as a generally rectangular plate or a suitably shaped conductive structure, is further provided for carrying substantially all current which flows along the conductive path to produce a magnetic field over a conductor region. Preferably, the sense and conductor regions are substantially nonoverlapping with respect to one another. Transformer means, such as a current transformer, is magnetically coupled to the conductor means to supply a predetermined level of electrical current which, for example, can be conveniently employed for electrically powering various circuits associated with the current sensor.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like numbers represent like parts throughout the drawings, and in which:

FIG. 2 shows an exemplary equivalent circuit model of a current sensor in accordance with the present invention;

FIG. 3A shows a perspective view of another exemplary embodiment of a current sensor employing parallel-plates and a conductor in accordance with the present invention;

FIG. 3B shows a side view of the current sensor shown in FIG. 3A;

DETAILED DESCRIPTION OF THE INVENTION

The present invention advantageously provides an improved alternating current sensor having a self-power capability which is essentially independent or separate from any current sensing or current measuring operation being carried in the current sensor. Further, the present invention provides a current sensor suitable for applications that demand high accuracy and high dynamic range while at the same time providing a current sensor having low-power consumption and small size characteristics.

Figure 1A:
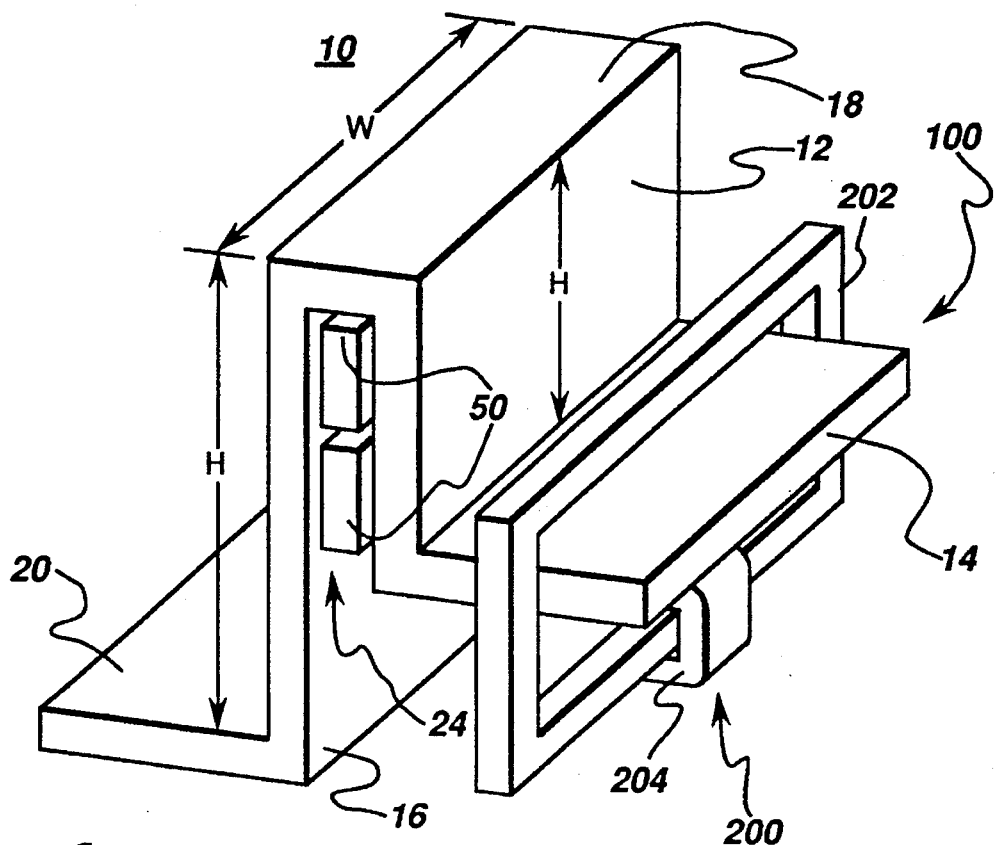
FIG. 1A shows a perspective view of one exemplary embodiment of a current sensor employing parallel-plates and a conductor in accordance with the present invention.
Figure 1B:
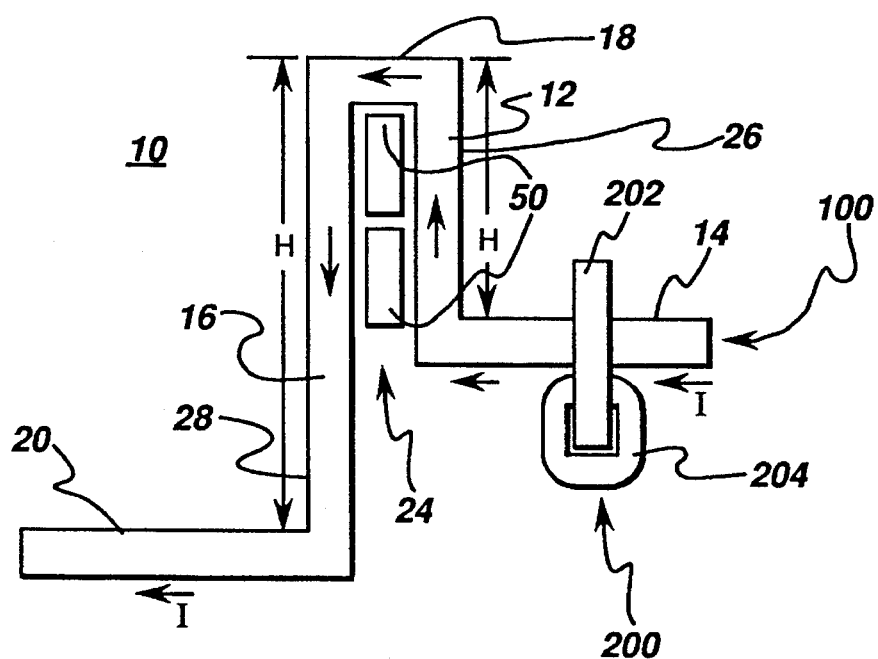
FIG. 1B shows a side view of the current sensor shown in FIG. 1A.

As shown in FIGS. 1A and 1B, a current sensor 10 comprises a first conductor plate 12 that receives current I via a suitable conductor means 100, which in this embodiment is made up of input terminal 14. Since the conductor means carries or conducts all of the current I, the current through input terminal 14 produces a magnetic field over a predetermined conductor region 104, best seen in FIG. 2. As will be explained shortly hereafter, within the predetermined conductor region, electrical power can be advantageously generated at a level sufficiently low for safely operating various circuits or electrical devices associated with the current sensor. This is generally known as a "self-powering" capability and hence the conductor means may be simply referred hereinafter as the "self-powering" conductor. Thus it will be appreciated that current conduction through input terminal 14, besides supplying current I to be measured by current sensor 10, allows for self-powering which is essentially separate from any current sensing or current measurement operation provided by the current sensor. However, such current conduction via input plate 14 for the purpose of self-powering is provided only by way of example and not of limitation, since it will be appreciated that such current conduction can be implemented in many alternative ways and need not be implemented in input terminal 14. A second conductor plate 16 is positioned in spaced relationship relative to first conductor plate 12 so as to substantially face conductor plate 12. A third conductor plate 18 is employed for electrically interconnecting conductor plates 12 and 16 to form a connected conductive path along conductor plates 12 and 16. A suitable output terminal 20 can be readily provided for supplying the current flowing therethrough. Terminals 14 and 20 can be conveniently employed for connecting current sensor 10 in series with a predetermined current source (not shown). By way of example, the three conductor plates may be constructed of a suitable conductive material such as copper, aluminum or a suitable metal alloy. Preferably, the conductive material can be readily cast or extruded to form an integral structure such as a generally U-shaped or rectangular structure. Alternatively, the three conductor plates may instead comprise individual conductor plates electromechanically connected to one another using suitable joints, or bolts and the like. The integral structure is preferred since such construction conveniently avoids heat dissipation at the joints and enables lower fabrication costs.

Figure 5:
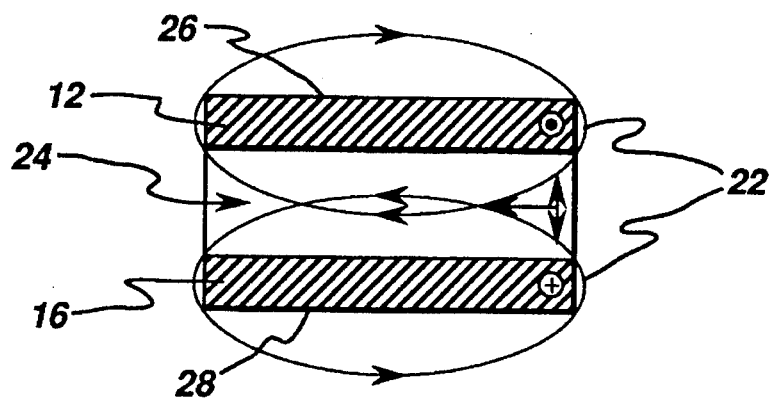
FIG. 5 shows respective cross sectional views of the parallel plates employed in a current sensor in accordance with the present invention, including a conceptual distribution of magnetic field constituents.

As shown in FIGS. 1A and 1B, the first and second conductor plates are preferably positioned substantially parallel relative to one another. Further, the first and second conductor plates are shaped to form respective magnetic field constituents substantially around the first and second conductor plates during current flow along the conductive path. A conceptual distribution of the magnetic field constituents is represented in FIG. 5 by respective ellipses 22 surrounding the respective cross-sections of conductor plates 12 and 16. As shown in FIG. 5, current is shown as flowing into plate 16 and out of plate 12. It will be appreciated that such current flow can be readily reversed so long as each respective current flow in conductor plates 12 and 16 is in mutually opposite directions. For example, in FIGS. 1a–1b, the role of terminals 14 and 20 could be readily reversed, i.e., terminal 20 could function as the input terminal and terminal 14 could function as the output terminal. In this case, current I would flow in a direction opposite to the arrows shown in FIGS. 1a–1b, however, the advantages of the present invention remain equally effective so long as each respective current flow in plates 12 and 16 is in mutually opposite directions with respect to one another.

As shown in FIGS. 1a–1b and 5, a passage 24 is defined between the first and second conductor plates. It can be shown that third conductor plate 18 forms a respective magnetic field constituent substantially around third conductor plate 18. It will be appreciated by those skilled in the art that the respective magnetic field constituents around each of the three conductor plates produce a combined magnetic field, in passage 24, that has a generally uniform direction that is substantially parallel to the first and second conductor plates. FIG. 1 further shows sensing means, such as sensor coils 50, for sensing or detecting changes in magnetic flux within a predetermined sense region. In FIGS. 1a–1b, the predetermined sense region is situated in passage 24. It will be appreciated that the predetermined sense region need not be limited to passage 24, since, as shown in FIG. 5, magnetic field constituents 22 are also formed or distributed near respective outer surfaces 26 and 28 of parallel plates 12 and 16. As will be explained shortly hereafter, this field distribution can be conveniently exploited for improving the dynamic range and accuracy of the current sensor. It will be understood that FIGS. 1a–1b shows two sensor coils 50 in passage 24 only by way of example and not by way of limitation, since even a single sensor coil could be effectively employed for detecting changes in magnetic flux within the predetermined sense region.

As shown in FIGS. 1a–1b, the conductor means can be conveniently shaped as a generally rectangular plate, which as previously suggested in this exemplary embodiment is made up of input terminal 14. It will be appreciated that the conductor means need not be limited to a rectangular plate geometrical configuration since other configurations other than rectangular, such as cylindrical, conical and the like will work equally effectively so long as the conductor means has a sufficiently large cross section to avoid substantial resistance heating and provide acceptable current carrying capacity. As suggested above, the conductor means carries substantially all current I which flows along the conductive path in order to produce a magnetic field over conductor region 104 (FIG. 2). Preferably, the sense and conductor regions are substantially nonoverlapping with respect to one another. This conveniently avoids or reduces undesirable magnetic cross-coupling effects in the conductor and sense regions. FIGS. 1a–1b further shows transformer means 200, such as a current transformer, magnetically coupled to the conductor means, substantially within conductor region, for supplying a predetermined level of electrical current suitable for electrically powering one or more circuits (not shown) associated with the current sensor. As shown in FIGS. 1a–1b, transformer means 200 comprises a magnetic core 202 shown, for example, around input terminal 14. A winding 204 is responsive to magnetic flux changes in magnetic core 202 to supply the predetermined level of electrical current for the self-powering operation.

As shown in FIG. 2, sensing region 24 and conductor region 104 are preferably substantially nonoverlapping so as to conveniently enable respective sensing and self-powering operations which, as previously suggested, are essentially independent or separate from one another. These separate operations advantageously avoids the use of any current shunt and also allows transformer 200 to have a much smaller weight, size and cost than would be feasible if a shunt and transformer were also employed for performing a highly accurate current measurement or sensing. For example, any magnetic core used with accurate shunts for precisely sensing current, (or for both sensing current and self-powering) must be carefully designed to have magnetic characteristics suitable for avoiding various undesirable magnetic effects, such as magnetic saturation conditions and other non-linear magnetic effects. Thus, the designer is typically forced to carefully choose from materials having a relatively high magnetic saturation density and to choose dimensions which generally result in oversized, heavy and bulky elements for any current shunt and associated transformer. Similarly, such accurate shunts and their associated transformers must be carefully designed to avoid thermal effects such as resistance heating which, if uncorrected, can detrimentally affect the current sensing accuracy. In contrast, the individual conductor and associated transformer in accordance with the present invention, i.e., a conductor and transformer which are exclusively used for self-powering and not for accurate current sensing, can now be fabricated using uncomplicated and straightforward design techniques which conveniently result in lighter, smaller and cheaper elements than would be possible if the respective sensing and self-powering applications were not independently conducted in accordance with the present invention.

FIGS. 3A and 3B show another embodiment for a current sensor in accordance with the present invention. FIGS. 3A and 3B, together with FIGS. 1A and 1B, show that the first and second conductor plates each comprises respective generally rectangular surface areas, which in the case of FIG. 3, substantially correspond to one another. However, as shown in FIGS. 1a–1b, the respective rectangular surface area of a given one of the first and second conductor plates can have at least one dimension, such as height or width, which has a different magnitude relative to the corresponding dimension of the other one of the first and second conductor plates. By way of example, in FIGS. 1a–1b, conductor plate 16 has a respective height dimension with a larger magnitude than the height dimension of conductor plate 12. Thus the effectiveness of the current sensor in accordance with the present invention is not limited due to geometrical symmetry between the two conductor plates. FIG. 3 further shows an alternative design for conductor means 100. As previously suggested, third conductor plate 18 forms a respective magnetic field constituent substantially around third conductor plate 18. Thus in this exemplary embodiment third conductor plate 18 conveniently constitutes the conductor means which in cooperation with transformer 200 allows for providing the self-powering operation, with the significant advantages described above.

Figure 4A:
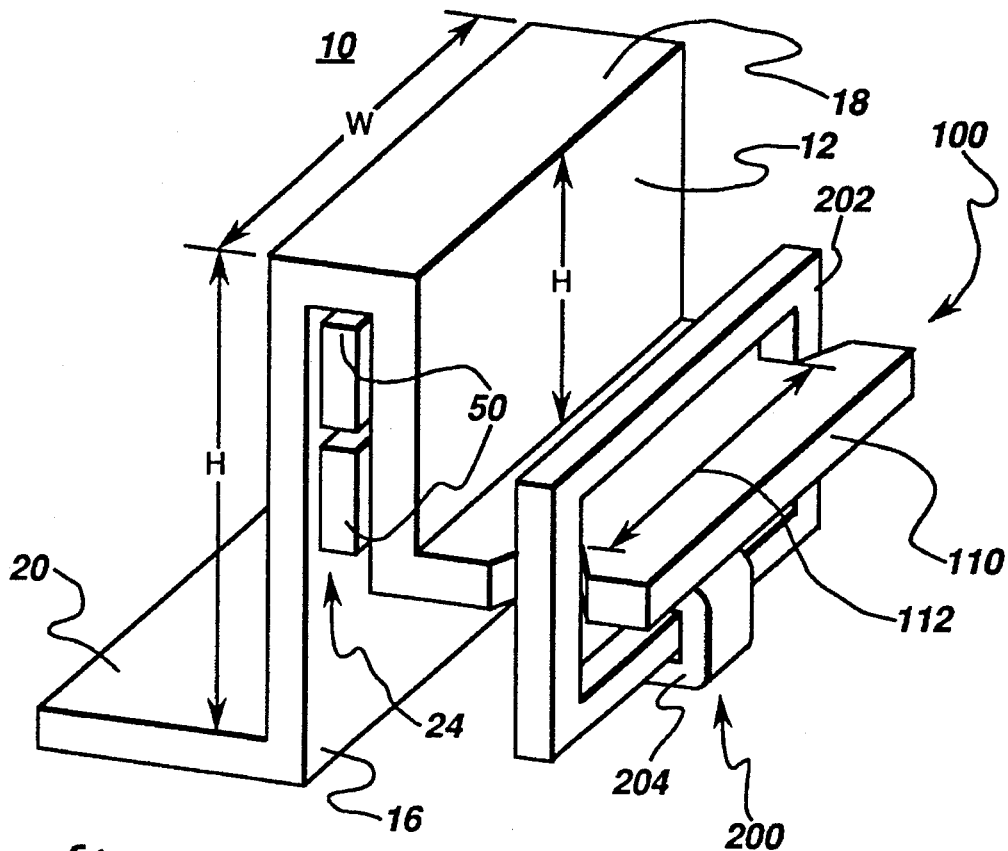
FIG. 4A shows a perspective view of yet another exemplary embodiment of a current sensor employing parallel-plates and a conductor in accordance with the present invention.
Figure 4B:
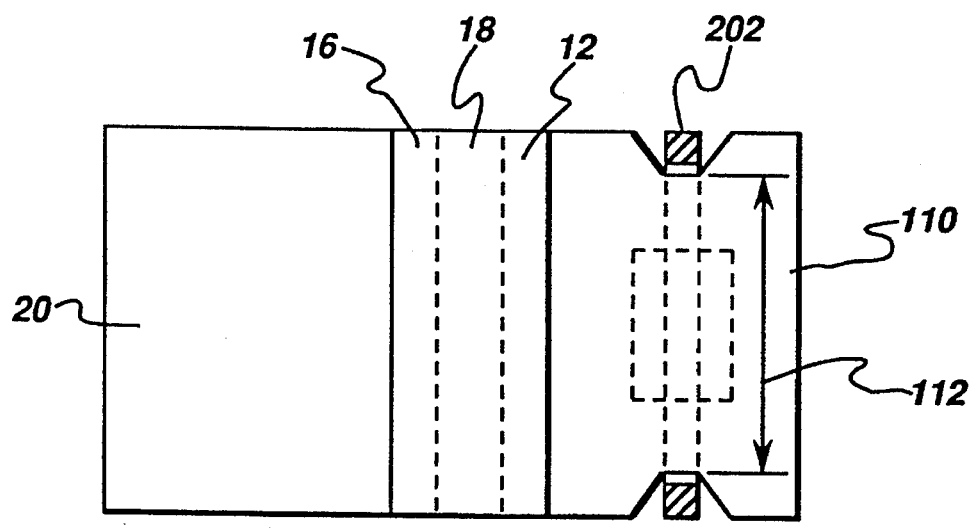
FIG. 4B shows a top plan view of the current sensor shown in FIG. 4A.

FIGS. 4A and 4B show yet another embodiment for a current sensor in accordance with the present invention. As shown in FIG. 4, the conductor means comprises a generally H-shaped structure 110 having a sufficiently narrow cross-section, schematically represented by twin-headed arrow 112, for receiving transformer 200 so as to conveniently reduce the overall volume occupied by transformer 200 around such narrow cross-section as well as the overall volume of the sensor. It will be appreciated that such generally H-shaped structure and the generally rectangular plate shown in FIGS. 1a–1b could be connected to second conductor plate 16 in lieu of first conductor plate 12. In each case, the self-powering conductor can be integrally connected to first and/or second conductor plates 12 and 16. Alternatively, structure 110 can be mechanically connected in current sensor 10 using suitable conductive bolts or joints and the like, designed to establish and maintain an effective electrical bond therethrough. Thus, in this exemplary embodiment such generally H-shaped structure, made of a suitable conductive material such as copper or aluminum, conveniently constitutes the conductor means which in cooperation with transformer 200 allows for providing a self-powering operation with the significant advantages described above. It will be appreciated that third conductor plate 18 can be similarly constructed to have such generally H-shaped configuration in order to provide the self-powering current conduction discussed in the context of FIG. 3.

Figure 6A:
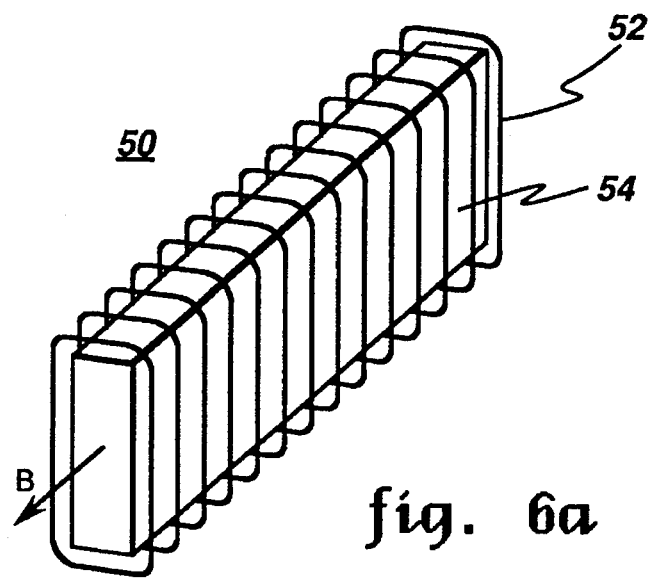
FIG. 6A shows a perspective view of one exemplary sensor coil in accordance with the present invention.
Figure 6B:
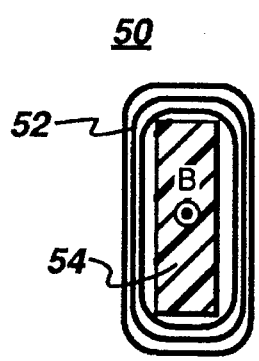
FIGS. 6B and 6C show, respectively, a side view and an elevation view of the sensor coil shown in FIG. 6A.
Figure 6C:
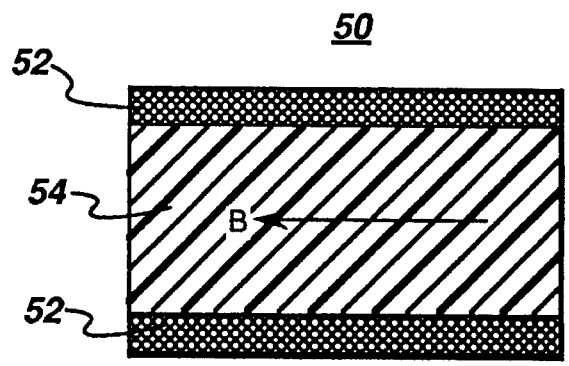

FIGS. 6A–6C show further details for an exemplary sensor coil 50 which can be conveniently employed in a current sensor in accordance with the present invention. Preferably sensor coil 50 comprises an air-core coil made up of a winding 52 wrapped around a suitable core 54 or bobbin having a substantially planar and generally rectangular wall being sufficiently thin to fit in passage 24 (FIGS. 1a–1b and 5). By way of example, the winding can be made of a suitable conductive material such as copper, or aluminum and the like. In the case of an air-coil, core 54 is made of a suitable nonmagnetic material such as plastic, which is molded or extruded to give the desired shape to core or bobbin 54. Although the present invention is not limited to air-core sensor coils, such sensor coils are preferred since their use conveniently avoids many of the drawbacks associated with a magnetic core material, such as magnetic saturation and temperature effects. Thus, this feature of the invention advantageously avoids undesirable magnetic core effects which, if left uncorrected, would detrimentally compromise the accuracy of the current sensor.

Figure 7:
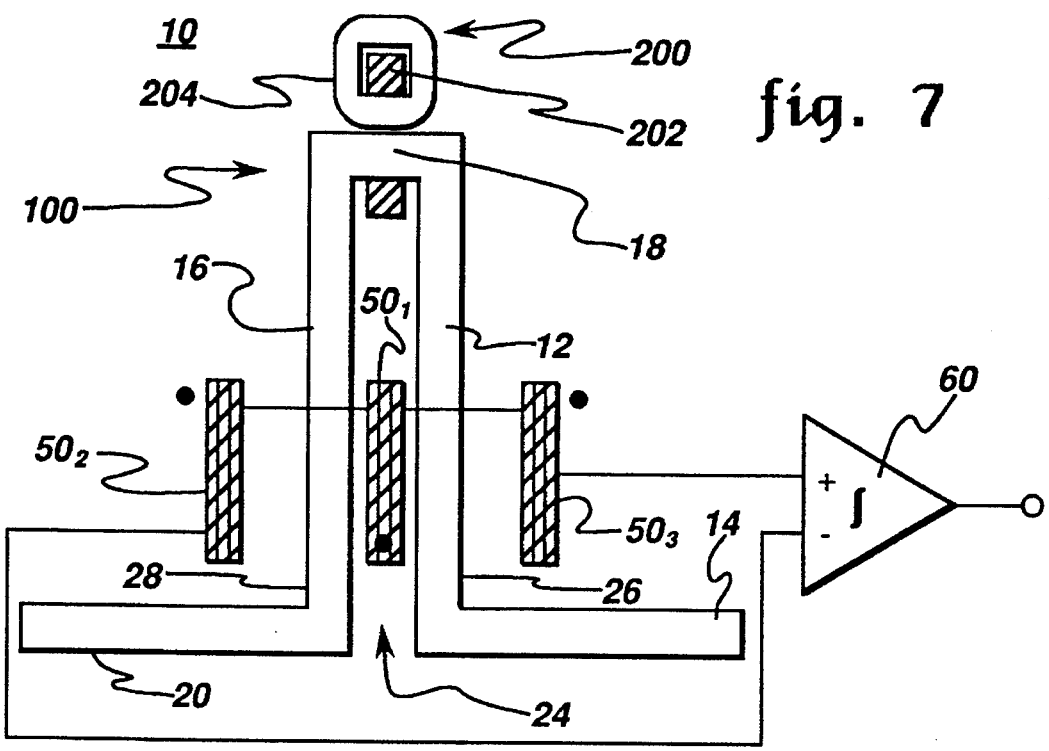
FIG. 7 shows a schematic view of serially coupled sensor coils in accordance with an exemplary mutual induction detection scheme suitable for the current sensor in accordance with the present invention.

FIG. 7 shows a current sensor 10 which employs by way of example a mutual induction detection scheme. As shown in FIG. 7, at least one sensor, such as sensor coil $50_1$, is situated in passage 24 between conductor plates 12 and 16. Additional sensors, such as sensor coils $50_2$ and $50_3$, are respectively positioned near respective outer surfaces 26 and 28 of conductor plates 12 and 16. Each of sensor coils $50_1$–$50_3$ is electrically coupled in series to one another so as to increase the overall dynamic range or sensitivity of the current sensor. Further, as represented by the solid dots near each respective sensor coil, any two successive sensor coils have respective windings designed to have an opposite polarity with respect to one another. For example, successive sensor coils $50_1$ and $50_3$ have respective windings designed to have an opposite polarity with respect to one another. Similarly, successive sensor coils $50_1$ and $50_2$ have respective windings designed to have an opposite polarity with respect to one another. As used herein the expression "any two successive sensor coils" refers to sensor coils arranged so that one of the successive sensor coils is situated in passage 24 and the other one is situated near one of the respective outer surfaces 26 and 28 of conductor plates 12 and 16, respectively. This particular sensor coil configuration is particularly advantageous for avoiding interference due to external magnetic fields as well as for increasing the dynamic range and sensitivity of the current sensor. In particular, the opposite winding polarity of any two successive sensor coils allows for additively combining any magnetic field constituents near the respective outer surfaces of parallel plates 12 and 16 with the magnetic field in passage 24. This is because, as shown in FIG. 5, the magnetic field constituents near the respective outer surfaces of parallel plates 12 and 16 have a respective direction which is opposite to the magnetic field direction in passage 24. In contrast, the opposite winding polarity of any two successive sensor coils allows for substractively canceling any externally produced magnetic field. This follows since it is highly unlikely for such externally produced magnetic field to substantially change or reverse its direction over the respective regions spanned by any two successive sensor coils. Thus, it will be appreciated that the current sensor in accordance with the present invention can be effectively employed for sensing applications which require multiple current sensors to be in relatively close proximity to one another, such as polyphase applications. This can be done with the present current sensor without having to use costly and bulky magnetic shields or magnetic cores for avoiding electromagnetic interference between such multiple current sensors. A suitable integrating amplifier 60 is coupled to receive the voltage signal output from sensor coils $50_1$–$50_3$ to provide a voltage signal which is proportional to the current to be measured and which provides an accurate current measurement. For example, integrating amplifier 60 may be comprised of an operational amplifier with a feedback capacitor (not shown) such that mathematically the signal at the output is the integral of the input signal.

Figure 8:
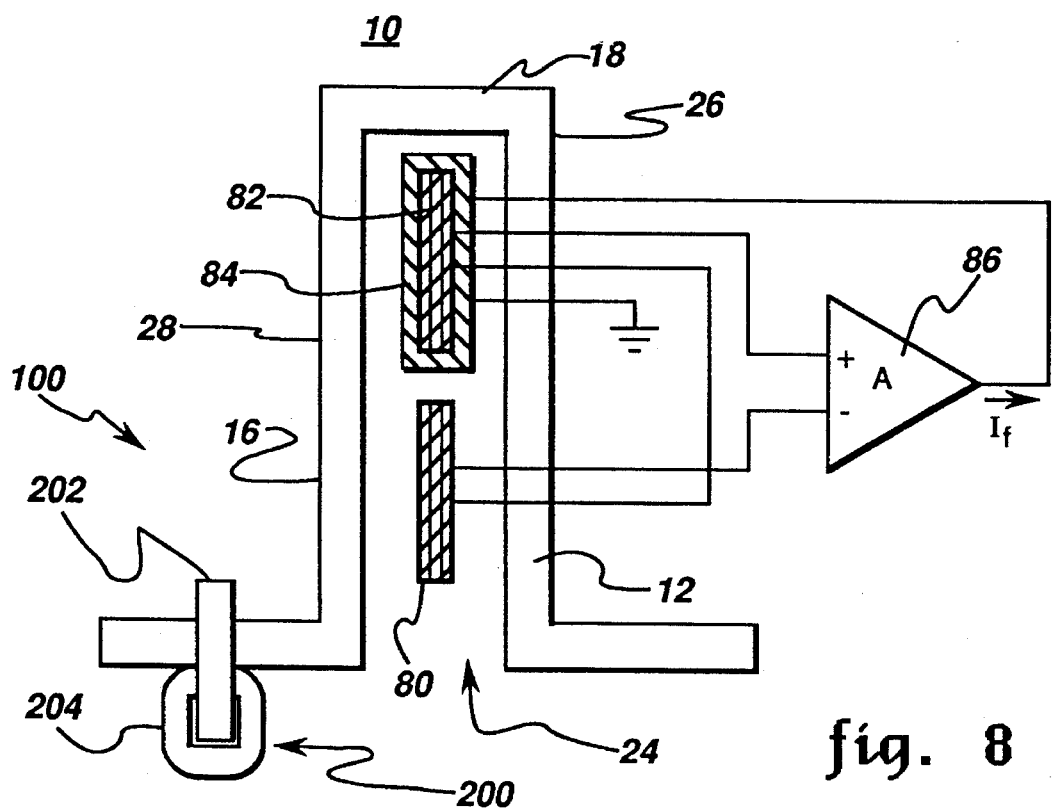
FIG. 8 shows a schematic view of magnetically coupled sensor coils in accordance with an exemplary reduced-flux detection scheme suitable for the current sensor in accordance with the present invention.

It will be appreciated that other detection schemes can be conveniently employed in a current sensor in accordance with the present invention. For example, as shown in FIG. 8, a reduced flux detection scheme can be conveniently employed in lieu of or in combination with the mutual induction detection scheme described in the context of FIG. 7. One such reduced flux detection scheme is described in U.S. application Ser. No. 08/085,789, entitled "Reduced Time Rate of Change Magnetic Flux Current Sensor" by E. Berkcan, assigned to the assignee of the present invention and herein incorporated by reference. As shown in FIG. 8, the sensing means comprises a reference coil 80, a sense coil 82 and a feedback coil 84 magnetically coupled to one another within a predetermined sense region. In FIG. 8, the predetermined sense region is in passage 24 between conductor plates 12 and 16. However, the predetermined sense region need not be limited to passage 24, since, as previously suggested, the predetermined sense region could also be near the respective outer surfaces 26 and 28 of the first and second conductor plates. A feedback generating circuit, such as an operational amplifier 86 or similar instrumentation amplifier, is responsive to the difference of respective AC signals being induced in reference coil 80 and in sense coil 82 for generating a feedback signal, such as current $I_f$, which is supplied to feedback coil 84 in order to predeterminedly reduce magnetic flux within the predetermined region. The feedback current $I_f$ in feedback coil 84 is proportional to the original or primary current I and provides an accurate current measurement. Although sense coil 82 and feedback coil 84 are shown as sensing changes in magnetic flux over an area substantially in common or incorporated within the cross-sectional area of a common core (not shown), it will be appreciated that the sense coil 82 and feedback coil 84 need not sense changes in magnetic flux over any such substantially common area or incorporated within the cross-sectional area of the common core. However, it may be desirable for sense coil 82 to have a cross-sectional area substantially overlapping with the cross-sectional area of feedback coil 84. Although the cross-sectional areas of the sensor coils are oriented substantially perpendicular to the direction of the magnetic field, it will now be appreciated that, either in the case of the mutual induction detection technique discussed in the context of FIG. 7 or the reduced flux detection technique discussed in the context of FIG. 8, the cross-sectional area of the sensor coils may be oriented at a predetermined angle with respect to the magnetic field other than substantially perpendicular so long as this orientation or predetermined angle is taken into account with regard to sensing and offsetting the changes in magnetic flux.

While only certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. An alternating current sensor comprising:

a first conductor plate;

a second conductor plate positioned in spaced relationship relative to said first conductor plate and substantially facing said first conductor plate;

a third conductor plate for electrically interconnecting said first and second conductor plates to form a connected electrically conductive path along said first and second conductor plates;

said first and second conductor plates shaped to form respective magnetic field constituents substantially around each of said first and second conductor plates during current flow along the conductive path;

sensing means for sensing changes in magnetic flux resulting from changes in said respective magnetic field constituents;

a magnetic core situated about said conductive path; and conductor means electrically interconnected with said first, second and third conductor plates for carrying substantially all current which flows along the conductive path and for producing a magnetic field through said magnetic core, said sensing means being spaced apart from said magnetic core.

2. The current sensor of claim 1 wherein said first and second conductor plates are substantially parallel to one another.

3. The current sensor of claim 2 wherein said conductor means comprises a generally rectangular plate electrically connected to a conductor plate selected from the group consisting of the first and second conductor plates.

4. The current sensor of claim 3 wherein said generally rectangular plate and said first conductor plate comprise an integral structure.

5. The current sensor of claim 3 wherein said generally rectangular plate and said second conductor plate comprise an integral structure.

6. The current sensor of claim 2 wherein said conductor means comprises a generally H-shaped structure.

7. The current sensor of claim 6 wherein said generally H-shaped structure is electrically connected to a conductor plate selected from the group consisting of the first and second conductor plates.

8. The current sensor of claim 7 wherein said generally H-shaped structure and said first conductor plate comprise an integral structure.

9. The current sensor of claim 7 wherein said generally H-shaped structure and said second conductor plate comprise an integral structure.

10. The current sensor of claim 1 further comprising transformer means magnetically coupled to said conductor means substantially within the conductor region for supplying a predetermined level of electrical current, said transformer means including a winding situated about said magnetic core.

11. The current sensor of claim 10 wherein said conductor means has a generally H-shaped structure having a sufficiently narrow cross-section for receiving said transformer means so as to reduce the overall volume occupied by said transformer means about said cross-section.

12. The current sensor of claim 11 wherein said first and second conductor plates each comprises a predetermined rectangular surface area.

13. The current sensor of claim 12 wherein each predetermined surface area of said first and second plates substantially corresponds to one another.

14. The current sensor of claim 13 wherein the rectangular surface area of one of said first and second conductor plates has at least one dimension having a different magnitude relative to the magnitude of the corresponding dimension of the other one of said first and second conductor plates.

15. The current sensor of claim 12 wherein said three conductor plates comprise an integral structure.

16. The current sensor of claim 15 wherein said last-recited structure comprises a generally U-shaped structure.

17. An alternating current sensor comprising:

a first conductor plate;

a second conductor plate positioned in spaced relationship relative to said first conductor plate and substantially facing said first conductor plate;

a third conductor plate for electrically interconnecting said first and second conductor plates to form a connected electrically conductive path along said first and second conductor plates;

said first and second conductor plates shaped to form respective magnetic field constituents substantially around each of said first and second conductor plates during current flow along the conductive path;

sensing means for sensing changes in magnetic flux resulting from changes in said respective magnetic field constituents; and a magnetic core situated about said conductive path; said third conductor plate carrying substantially all current which flows along the conductive path for producing a magnetic field through said magnetic core, said sensing means being spaced apart from said magnetic core.

18. The current sensor of claim 17 wherein said sensing means comprises at least one sensor adapted to be received in a passage between said first and second conductor plates.

19. The current sensor of claim 18 wherein said at least one sensor comprises an air-core coil.

20. The current sensor of claim 18 wherein said sensing means further comprises additional sensors respectively positioned near respective outer surfaces of said first and second conductor plates, said at least one sensor and said additional sensors being coupled in series to one another.

21. The current sensor of claim 20 wherein any two successive sensors of said at least one sensor and said additional sensors have respective coils adapted to have an opposite polarity with respect to one another.

* * * * *